United States Patent [19]

Kemp et al.

[11] 4,080,567
[45] Mar. 21, 1978

[54] HEAT SENSITIVE ABNORMAL CONDITION DETECTING AND INDICATING DEVICE AND METHOD

[75] Inventors: Wallace C. Kemp, Lafayette, Ind.; John M. Carr, Fort Washington, Pa.

[73] Assignee: Duncan Electric Company, Inc., Lafayette, Ind.

[21] Appl. No.: 585,109

[22] Filed: Jun. 9, 1975

[51] Int. Cl.$^2$ .............................................. G01R 1/36
[52] U.S. Cl. ..................................... 324/110; 73/358; 340/253 A
[58] Field of Search ................... 324/110; 340/253 A, 340/253 R; 73/358; 116/114.5

[56] References Cited

U.S. PATENT DOCUMENTS

| | | | |
|---|---|---|---|
| 1,387,890 | 8/1921 | Kleidman | 73/358 |
| 1,443,786 | 1/1923 | Dolph | 73/358 |
| 1,935,093 | 11/1933 | Keller | 340/253 A |
| 1,994,222 | 3/1935 | Le Roy | 340/253 A |
| 2,094,293 | 9/1937 | Dupont | 73/358 |
| 3,140,611 | 7/1964 | Kliewer | 73/358 |

Primary Examiner—Rudolph V. Rolinec
Assistant Examiner—Ernest F. Karlsen
Attorney, Agent, or Firm—John R. Nesbitt

[57] ABSTRACT

A heat sensitive abnormal current condition detecting and indicating device associated with a watthour meter indicates that a possibly damaging surge has been experienced by the meter. The abnormal condition detecting and indicating device includes indicator means retained in normal position by a heat sensitive material, such as solder, with the indicator means being biased to move from the normal position to an abnormal condition position should the conductor being monitored experience a heat rise sufficient to soften the heat sensitive material and release the indicator means. A plurality of embodiments of the heat sensitive abnormal condition detecting and indicating device are shown including a rod maintained in normal position within a tube under spring bias with the rod being movable longitudinally to thereafter extend from the tube to indicate a possible abnormality when a monitored conductor experiences a heat rise sufficient to melt solder holding the rod in normal position, a flag mounted on a rotatable wheel and rod assembly maintained in a rotational normal position with a spring bias thereon so that the wheel and rod assembly rotates to a position wherein the flag indicates an abnormal condition when a monitored conductor experiences a heat rise sufficient to melt solder holding the wheel and rod assembly in normal position, and a spring arm held against the monitored conductor by means of solder so that a possibly damaging surge experienced sufficient to heat the conductor and melt the solder frees the spring load arm to spring outwardly for visually indicating that a possible abnormal condition has occurred.

5 Claims, 6 Drawing Figures

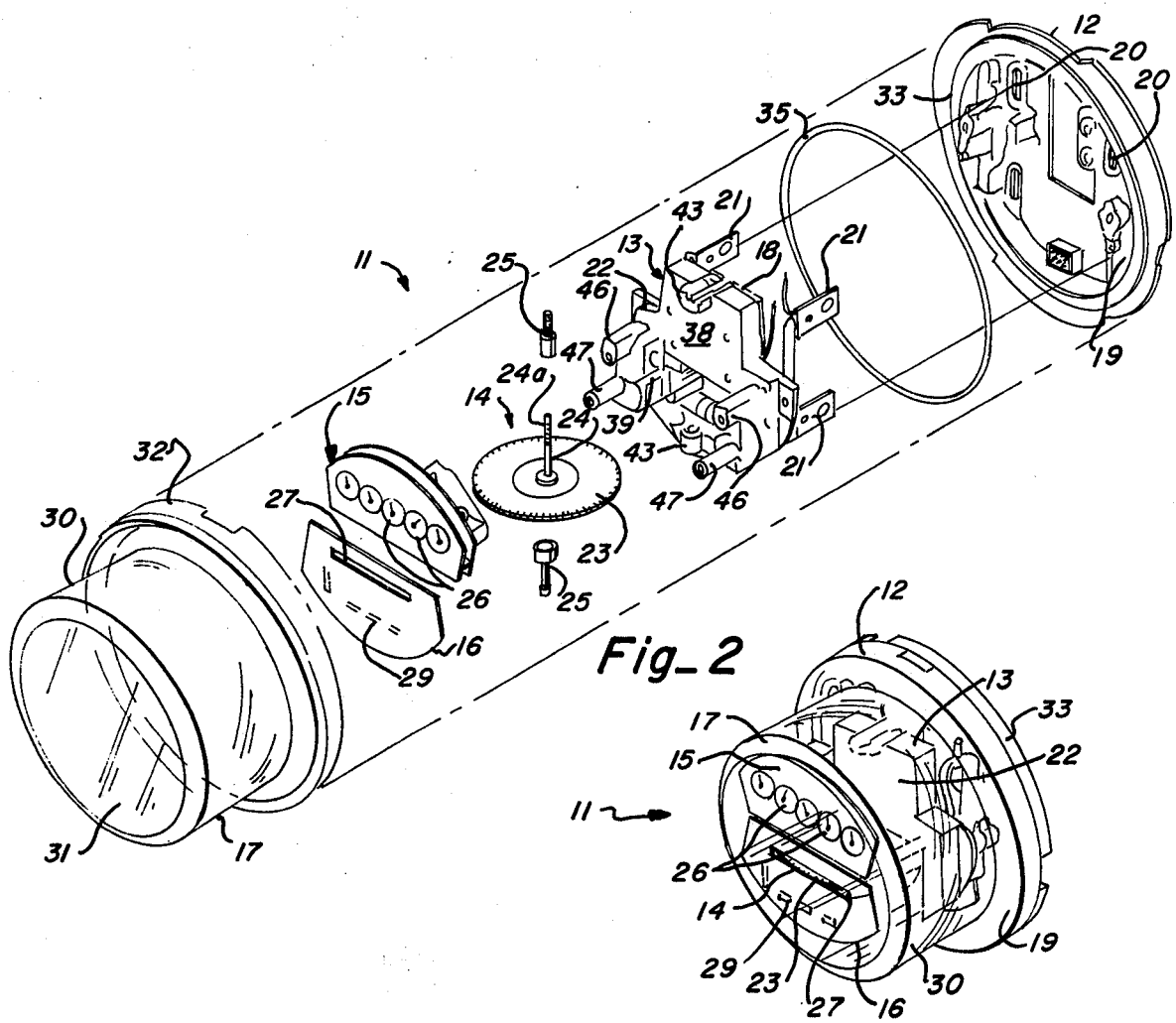
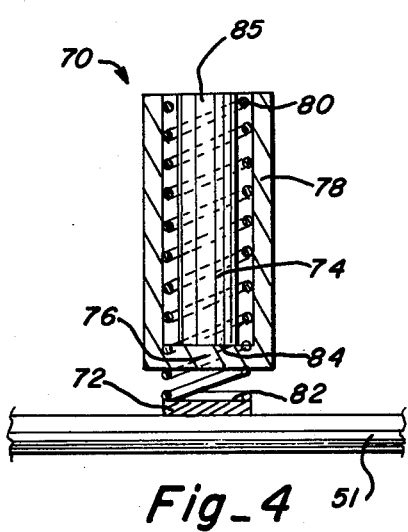

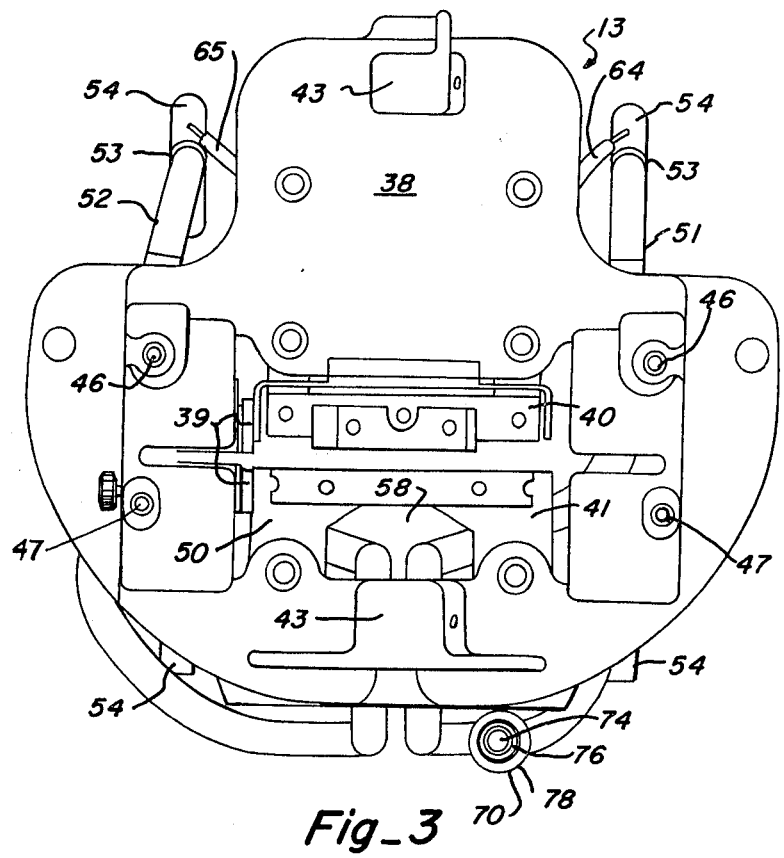
Fig_3
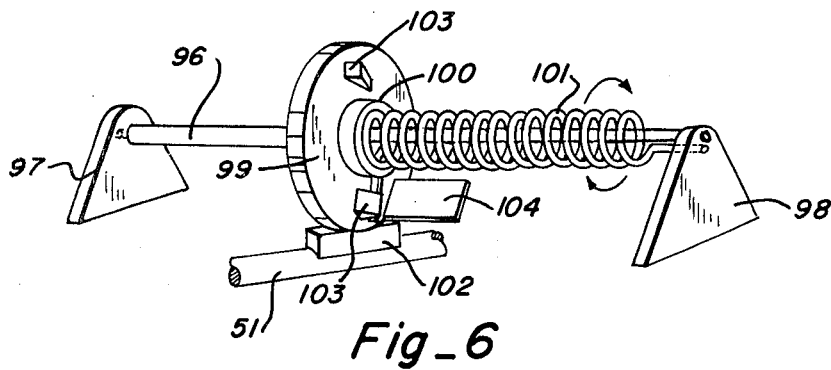
Fig_6
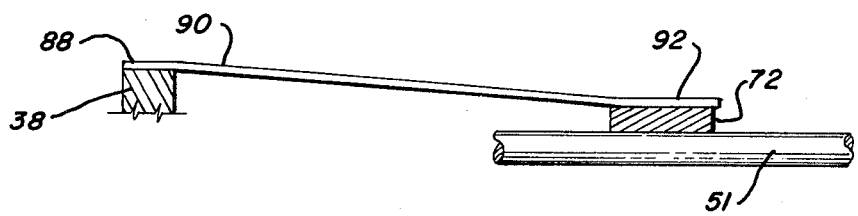
Fig_5

HEAT SENSITIVE ABNORMAL CONDITION DETECTING AND INDICATING DEVICE AND METHOD

FIELD OF THE INVENTION

This invention relates to a heat sensitive abnormal condition detecting and indicating system and method, and, more particularly, relates to such a system and method that is suitable for incorporation in an electric meter such as a watthour meter.

BACKGROUND OF THE INVENTION

It is oftentimes necessary, or at least desirable, that various electrical instruments be monitored and an indication established if an abnormality should be imposed at any time on the instrument such that the instrument might not thereafter be suitable for its intended purpose. Such is the case, for example, where integrating meters, such as the common watthour meter, are concerned. As is well known, the induction watthour meter normally includes a rotatable disk the speed of which is made proportional to the power delivered to the metered load. Hence, the total number of revolutions by the disk is proportional to the energy consumed so that when used with a calibrated meter, the meter will cumulatively indicate the amount of electrical energy consumed by the load connected with the meter. In the watthour meter, damping, or drag, magnets are commonly utilized to retard disk speed of rotation to thus cause the speed to be made proportional to the power flow through the meter. It is important that the strength of the damping magnets be constant when utilized in the meter since any change in strength after the meter is calibrated and put into service will cause an error in meter readings.

It has heretofore been common when utilizing damping magnets for watthour meters to partially de-magnetize permanent magnets before using the same in commercial meters. Such a process has been successful in stabilizing such magnets for use in watthour meters that are of sufficient reliability so as not to adversely affect watthour meter readings for normal use. It has been found that under unusually severe power frequency faults, the meter may experience a heat producing fault current which generates a field of sufficient magnitude to adversely affect the meter. Since possibly damaging current surges produce heat in the current coils, monitoring of these coils by a heat sensitive abnormal condition indicator enables continual meter monitoring and indications to be made if a possibly damaging surge occurs. Obviously, if a possibly damaging current surge has occurred, then it is important that the then possibly unreliable meter be tested to insure continued reliability or be replaced, if necessary.

While various devices have been heretofore suggested for monitoring and indicating purposes, and while devices for monitoring meters to indicate a surge have heretofore been known and/or utilized, none of these devices have been completely successful in solving the problem in a reliable manner and/or have not solved the problem in such a manner so as to make the necessary indication (such as a received current surge) readily discernible at the meter. Some such prior art devices have, for example, utilized various indicators that have included, generally, flags, fuses, or temperature sensitive bands or paints attached to the permanent magnet and caused to change color or fall off when an induced current surge is experienced. An example of this type of indicator is shown in U.S. Pat. No. 2,236,277 issued to G. R. Sturtevant on March 25, 1941. The present invention is not frequency limited (such as the Sturtevant device).

SUMMARY OF THE INVENTION

This invention provides an improved heat sensitive abnormal condition detecting and indicating device and method that is particularly useful for and in connection with electric metering devices such as watthour meters and provides an indication of a possibly damaging current that is readily discernible at the meter. The heat sensitive abnormal condition detecting and indicating device of this invention includes indicator means retained in normal position by a heat sensitive material with the indicator means being biased to move from the normal position to an abnormal condition position should the conductor being monitored experience a heat rise sufficient to soften the heat sensitive material and release the indicator means.

It is therefore an object of this invention to provide an improved heat sensitive abnormal condition detecting and indicating device and method.

It is another object of the invention to provide an improved heat sensitive abnormal condition detecting and indicating device that is particularly useful in electric meters such as watthour meters.

It is yet another object of this invention to provide an improved heat sensitive abnormal condition detecting and indicating device that utilizes a combination of a heat sensitive material and a biased indicator means to provide an indication of a possible abnormality.

It is another object of this invention to provide an improved method for detecting and indicating abnormalities.

With these and other objects in view as will become apparent to one skilled in the art as the description proceeds, this invention resides in the novel construction, combination, and arrangements of parts substantially as hereinafter described and more particularly defined by the appended claims, it being understood that such changes in the precise embodiments of the herein disclosed invention are meant to be included as come within the scope of the claims.

BRIEF DESCRIPTION OF THE DRAWINGS

The accompanying drawings illustrate complete embodiments of the invention according to the best mode so far devised for the practical application of the principles thereof, and in which:

FIG. 1 is a perspective view of a watthour meter having the abnormal condition detector and indicating device of this invention incorporated therein;

FIG. 2 is an exploded view of the watthour meter shown in FIG. 1;

FIG. 3 is a front view of the frame and stator assembly of the watthour meter shown in FIGS. 1 and 2 and illustrates one embodiment of the abnormal condition detector and indicating device of this invention incorporated therein;

FIG. 4 is a side view of the abnormal condition detector and indicating device shown in FIG. 3 contiguous to a conductor to be monitored;

FIG. 5 is a perspective view showing a second embodiment of the abnormal condition detector and indicating device of this invention; and FIG. 6 is a perspective view showing a third embodiment of the abnormal condition detector and indicating device of this invention.

DESCRIPTION OF THE INVENTION

Referring now to the drawings, the numeral 11 refers generally to a watthour meter having the abnormal condition detector and indicating device of this invention incorporated therein. As shown best in FIGS. 1 and 2, watthour meter 11 conventionally includes a base plate 12, a frame and stator assembly 13, a disk assembly 14, a register assembly 15, a name plate 16, and a glass cover 17.

As shown, frame and stator assembly 13 is mounted at the rear side 18 to the inner side 19 of base plate 12, and base plate 12 includes a plurality of apertures 20 through which electrical connectors 21 extend rearwardly from the base plate.

Disk assembly 14 is mounted at the front side 22 of the frame and stator assembly so that disk 23 of the disk assembly 14 rotates along with shaft 24 which shaft is mounted for rotation in the frame and stator assembly by means of bearings 25. As is conventional, rotation of the disk rotates shaft 24 having worm gear 24a thereon to drive the recording dials 26 of register assembly 15 which is likewise mounted to the front side 22 of frame and stator assembly 13. Plate 16 is mounted to the frame ans stator assembly 13 below the register assembly and has an aperture 27 through which a portion of the periphery of disk 23 extends so as to be visible from the front of the assembled meter as shown in FIG. 1. If desired, plate 16 may have a suitable indicia thereon (as indicated in FIGS. 1 and 2 by the interrupted parallel lines 29).

Glass cover 17 has a cylindrical portion 30 closed at one end 31 and terminating at the other end in an opening defining circular peripheral lip portion 32 that seats against the base plate near the periphery 33 thereof to enclose the remainder of the meter therebetween. A gasket 35 provides a seal between base plate 12 and glass cover 17.

Since conventional electric metering devices such as a watthour meter are well known, it is not felt necessary to describe such as meter in great detail herein except as is deemed desirable to better illustrate the abnormal condition detecting and indicating system of this invention which is utilized in such a meter. For greater detail concerning the watthour meter, attention is invited to Electrical Metermen's Handbook, Seventh Edition, published in 1965 by Edison Electric Institute, New York, N.Y.

In operation, a driving torque is developed in the disk 23 by the joint action of the alternating magnetic fluxes produced by the potential stator and by the current stator, and the energy consumed by the load is measured by the meter and recorded by register 15. The driving torque and retarding torque are both developed in the disk. The disk rotates between the poles of the drag magnet to develop a retarding torque proportional to the angular velocity of the disk.

The heat sensitive abnormal condition detecting and indicating device of this invention is associated with the current stator and the frame and stator assembly has therefore been shown in more detail in FIG. 3. As shown in FIG. 3, frame and stator assembly 13 includes a frame 38 upon which is mounted a pair of damping magnets 39, a potential stator 40, and a current stator 41. As also shown, disk assembly mounts 43, having bearings 25 received therein, mount the disk assembly 14. Mounts 46 and 47 are also provided at the front side 22 of the frame and stator assembly 13 to mount the register assembly and name plate, respectively, to the frame and stator assembly.

Current stator 41 includes a current core 50 about which current coils 51 and 52 are wound. As shown, coils 51 and 52 are enlarged at shoulders 53, which shoulders terminate at blade abutments 54. If desired, compression gaskets (not shown) may also be utilized. As also shown, coils 51 and 52 extend from shoulders 53 and then are curved across the front face of the current core and through an aperture 58 therein, then extend outwardly across the back side of the current core and from there extend to additional shoulders 53 which likewise terminate at their opposite sides at contact blades 21. Again, compression gaskets (not shown) may be utilized, if desired. As brought out hereinabove, contact blades 21 extend rearwardly from the current stator and may pass through the base plate 12 to extend rearwardly therefrom. Additionally, as shown in FIG. 3 potential leads 64 and 65 leading to potential stator 40, and more particularly to the potential coil therein, are also connected with plates 54.

The abnormal condition detector and indicating system 70 of this invention is shown in one embodiment in FIGS. 3 and 4. As shown best in FIG. 4, current stator coil 51 (coil 52 may be identical with respect to having the abnormal condition detecting and indicating device associated therewith) is a current carrying conductor having a heat sensitive material 72, such as solder, positioned thereon. The heat sensitive material is preferably solder, with solder including a low melting point metal, epoxy, heat sensitive adhesives, and the like, and may be positioned on the coil as desired.

The abnormal condition detector and indicating system 70 includes an indicator rod 74 having a spring 76 therearound with the rod and spring being received within a tube 78 (preferably made of insulating material). The spring is attached near one end 80 to tube 78 and rod 74 is attached to the spring inwardly of spring end 82 at point 84 as indicated in FIG. 4. End 82 of spring 76 is maintained at conductor, or coil, 51 by means of solder 72. Tube 78 is positioned, as by being fastened to frame 38 of the meter, so that the spring is extended while in contact with solder 72. Upon release from the solder, the spring retracts to move rod 74 longitudinally with respect to tube 78 to thereby expose one end 85 of the rod by moving the same outwardly from tube 78.

Thus, in operation, when an abnormal condition current is experienced, the solder melts and spring 76 retracts to move end 85 of indicator rod 74 out of its normal position within tube 78 to an abnormal condition position to thereafter provide an indication that a possible abnormality has occurred. The abnormal condition detector and indicating system is responsive to an $I^2Rt$ function, where I is current, R is resistance, and $t$ is time, and operation (ie, melting of the solder to indicate an abnormality) is thereafter dependent thereon. This is in contrast to frequency dependent systems such as, for example, the system described in U.S. Pat. No. 2,236,277.

If desired, rod 74 could, of course, activate a separate abnormal condition indicator, and heat sensitive material other than solder could be selected with a different melting point as desired to make the abnormality indication occur at a lower or higher temperature as desired.

Alternate embodiments of the abnormal condition detecting and indicating system of this invention are shown in FIGS. 5 and 6. As shown in FIG. 5, coil 51 (coil 52 could be identically fitted) has one end 88 of a spring loaded arm 90 attached to frame 38 with the opposite, or free end, 92 of the arm being held against coil 52 by solder 72.

When a surge is experienced, the solder melts to allow the spring loaded arm 90 to assume its normal unloaded state with the free end 92 displaced outwardly from the coil to thereafter indicate that a possible abnormality has occurred.

FIG. 6 illustrates a third embodiment of the abnormal condition detecting and indicating system. As shown, a rod 96 is rotatably mounted on the frame by support tabs 97 and 98. A wheel 99 is fixed to rod 96 near the central portion thereof with the periphery of wheel 99 being positioned contiguous to conductor, or coil, 51. Spring 101 surrounds rod 96 and is connected at opposite ends to the wheel and support tab 98, the connection to the wheel being through trip pawl 100. The periphery of wheel 99 is soldered to (or in close proximity to) coil 51 with spring 101 placing a rotational bias on the wheel. When a heat rise in coil 51 is experienced sufficient to melt solder 72 (preferably contained in pot 102), the wheel and rod rotate due to the bias of spring 101, and wheel 99 has pawl catches 103 thereon. Upon rotation of wheel 99 from the normal position to the abnormal condition position, a flag 104 attached to trip pawl 100 is displayed. Trip pawl 100 is manually rotatable in the direction opposite to that normally provided by the bias of spring 101 (ie, preferably counter-clockwise) and thus can be manually reset after a possible abnormality has been indicated and the solder fixing the wheel has solidified. An indicator other than a flag could, of course, be utilized as could other types of rotational stops and the like.

As will be appreciated from the foregoing, this invention provides an improved heat sensitive abnormal condition detecting and indicating device and method that is well suited for indicating possible abnormalities that can occur in an electric meter such as a watthour meter after a current surge has been received at the meter.

What is claimed is:

1. In an electric meter such as a watthour meter having a current coil that becomes heated in response to current surges received by said meter, a heat sensitive abnormal condition monitoring device, comprising:

a detector element contiguous to said current coil of said watthour meter, said detector element having a low melting point whereby said detector element assumes at least a partial liquid state when a current surge is received at said meter sufficient to heat said detector element to at least a predetermined temperature; and an indicating element acted upon by said detector element when said detector element assumes said at least partial liquid state, said indicating element having a tube, a rod received within said tube, and spring means surrounding at least a portion of said rod within said tube with said spring means operatively connecting said tube and rod so that said spring means acts upon said rod to bias said rod toward an abnormal condition indicating position wherein one end of said rod extends from said tube, said rod being retained by said detector element in a normal indicating position until said detector element assumes said at least partial liquid state to allow said rod to assume said abnormal condition indicating position.

2. In an electric meter such as a watthour meter having a current coil that becomes heated in response to current surges received by said meter, a heat sensitive abnormal condition monitoring device, comprising:

a detector element contiguous to said current coil of said watthour meter, said detector element having a low melting point whereby said detector element assumes at least a partial liquid state when a current surge is received at said meter sufficient to heat said detector element to at least a predetermined temperature; and an indicating element acted upon by said detector element when said detector element assumes said at least partial liquid state, said indicating element having a rotatable rod, a wheel mounted on said rod, and spring means surrounding at least a portion of said rod with said spring means operatively connecting said rod and wheel so that said spring means acts upon said wheel to bias said wheel toward an abnormal condition indicating position wherein said wheel is rotated to a predetermined position, said wheel being retained by said detector element in a normal indicating position until said detector element assumes said at least partial liquid state to allow said wheel to assume said abnormal condition indicating position.

3. The heat sensitive abnormal condition monitoring device of claim 2 wherein said spring is connected with said wheel through pawl means, and wherein said rotation of said wheel to said abnormal condition indicating position is limited by stop means.

4. The heat sensitive abnormal condition monitoring device of claim 3 wherein said pawl means has flag indicator means connected therewith to provide an indication of a possible abnormality when said wheel has been rotated to said abnormal condition indicating position.

5. The heat sensitive abnormal condition monitoring device of claim 3 wherein said pawl means may be manually rotated in the direction opposite to rotation of said wheel to said abnormal condition indicating position to thereby reset said device after a possible abnormal condition has been indicated.

* * * * *